United States Patent
Williams et al.

(10) Patent No.: US 7,317,256 B2
(45) Date of Patent: Jan. 8, 2008

(54) ELECTRONIC PACKAGING INCLUDING DIE WITH THROUGH SILICON VIA

(75) Inventors: Christina K. Williams, Phoenix, AZ (US); Rainer E. Thomas, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/142,972

(22) Filed: Jun. 1, 2005

(65) Prior Publication Data

US 2006/0273455 A1   Dec. 7, 2006

(51) Int. Cl.
*H01L 23/52* (2006.01)
*H01L 23/48* (2006.01)
*H01L 29/40* (2006.01)

(52) U.S. Cl. .............................. 257/777; 257/E27.137; 257/723; 257/685; 257/686; 438/108; 438/109; 361/760

(58) Field of Classification Search ........ 257/E27.137, 257/E27.144, E27.161, 777, 723, 685, 686; 438/108, 109; 361/760
See application file for complete search history.

(56) References Cited

U.S. PATENT DOCUMENTS

| | | | | |
|---|---|---|---|---|
| 5,399,898 A | * | 3/1995 | Rostoker | 257/499 |
| 5,404,044 A | * | 4/1995 | Booth et al. | 257/698 |
| 5,608,264 A | * | 3/1997 | Gaul | 257/734 |
| 5,973,396 A | * | 10/1999 | Farnworth | 257/698 |
| 6,002,177 A | * | 12/1999 | Gaynes et al. | 257/774 |
| 6,249,136 B1 | * | 6/2001 | Maley | 324/765 |
| 6,353,539 B1 | * | 3/2002 | Horine et al. | 361/736 |
| 6,395,630 B2 | * | 5/2002 | Ahn et al. | 438/667 |
| 6,404,061 B1 | * | 6/2002 | Hikita et al. | 257/777 |
| 6,410,431 B2 | * | 6/2002 | Bertin et al. | 438/667 |
| 6,444,576 B1 | * | 9/2002 | Kong | 438/667 |
| 6,448,661 B1 | * | 9/2002 | Kim et al. | 257/777 |
| 6,577,013 B1 | * | 6/2003 | Glenn et al. | 257/777 |
| 6,608,371 B2 | * | 8/2003 | Kurashima et al. | 257/686 |
| 6,639,303 B2 | * | 10/2003 | Siniaguine | 257/621 |
| 6,664,129 B2 | * | 12/2003 | Siniaguine | 438/107 |
| 6,699,787 B2 | * | 3/2004 | Mashino et al. | 438/667 |
| 6,717,251 B2 | * | 4/2004 | Matsuo et al. | 257/686 |
| 6,908,785 B2 | * | 6/2005 | Kim | 438/106 |
| 6,982,487 B2 | * | 1/2006 | Kim et al. | 257/774 |

OTHER PUBLICATIONS

"Through-Silicon Contacts," Tru-Si Technologies, http://web.archive.org/web/20010629231505/http://www.trusi.com/throughsiliconvias.html, 1 pg.

* cited by examiner

*Primary Examiner*—Kenneth Parker
*Assistant Examiner*—Chris C. Chu
(74) *Attorney, Agent, or Firm*—Scwhabe, Williamson & Wyatt, P.C.

(57) ABSTRACT

An apparatus, method, and system for electronic device packaging having stacked dice are disclosed herein. A first die has a through silicon via formed therethrough. A second die is landed on the through silicon via of the first die. A mount having a lead is coupled to the through silicon via of the first die.

16 Claims, 5 Drawing Sheets

ELECTRONIC PACKAGING INCLUDING DIE WITH THROUGH SILICON VIA

FIELD OF THE INVENTION

Embodiments of the present invention relate to, but are not limited to, electronic devices, and in particular, to the field of electronic device packaging.

BACKGROUND OF THE INVENTION

To enable electronic equipment such as laptops and mobile phones to become smaller, electronic packages that may be contained in these devices have been becoming smaller. One approach for reducing the size of electronic packages includes stacking two or more chips or dice in these packages. Each of these dice may be, for example, a processor, input/output device, graphical co-processor, a digital signal processor, nonvolatile and/or volatile memory, and the like.

In some situations, the stacked dice are spaced apart for various reasons including, for example, to prevent wire bonds that may couple an underlying die to a package substrate from being damaged by the overlying die or preventing the dice from being in direct contact with each other. In stacked-chip packages in which at least the same size or bigger die is placed on top of another smaller or equal-sized die, spacers are typically placed between the dice to maintain a certain gap between the dice.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

An apparatus, method, and system for electronic device packaging having stacked dice are disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Figure 1:
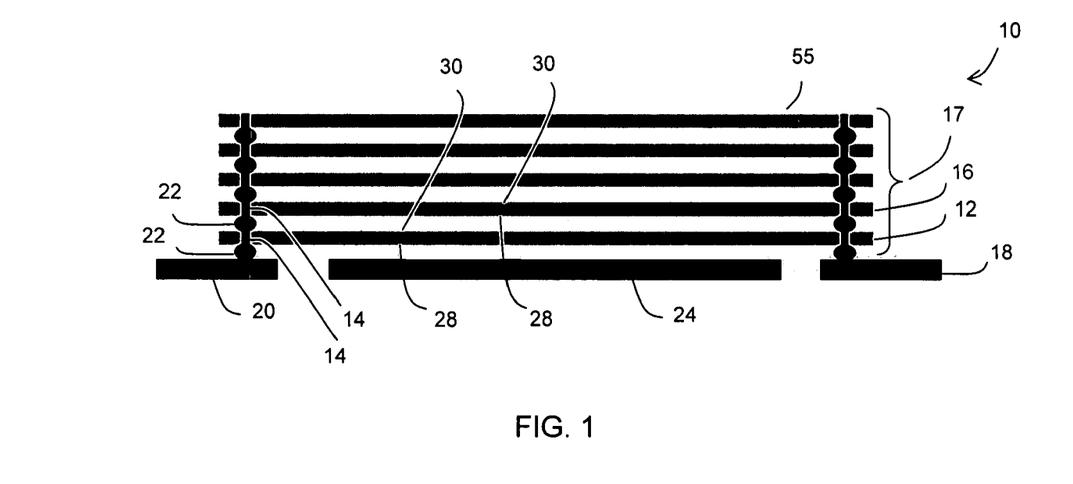
FIG. 1 is a cross sectional view illustrating an electronic package, in accordance with some embodiments of the present invention.

FIG. 1 illustrates a portion of an electronic package 10, in accordance with one embodiment. The electronic package 10 may include a first die 12 having a plurality of through silicon via 14 (TSV) formed therethrough. A second die 16 may be landed on the plurality of through silicon via 14 of the first die 12, forming at least a portion of a die stack 17. In some embodiments of the present invention, the die 12 and 16 (as well as other die in die stack 17) may be Flip Chip memory.

A mount 18 having a plurality of leads 20 may be coupled to the plurality of through silicon via 14 of the first die 12. In some embodiments of the present invention, the mount 18 may be a leadless quad flat-pack, a leadless small outline integrated circuit (SOIC), a leadless thin small outline package (TSOP), leaded SOIC, leaded quad flat-pack, leaded TSOP, or variants thereof.

A solder joint 22 may be coupled between the through silicon via 14 of the first die 12 and the lead 20 of the mount 18. Examples of materials suitable for forming solder joint 22 include, but are not limited to lead based solder materials, non-lead based solder materials and the like. For the purpose of this application, the term "solder joint" as used herein are to be accorded a broad meaning, including "solder joints" of any variety of suitable materials (including but not limited to lead, lead/tin alloys, lead free alloys (such as tin/silver, tin/copper/silver, and copper alloys), and the like), having suitable material properties (including but not limited to eutectic solder), used in a wide range of packaging techniques (including but not limited to flip-chip), and processes (including but not limited to controlled collapse chip connection (C4)).

Additional through silicon vias 14 may also be formed through second die 16. An additional solder joint 22 may be coupled between the through silicon via 14 of the first die 12 and the through silicon via 14 of the second die 16. Similarly, any other die in die stack 17 may have through silicon vias 14 formed therethrough coupled to an adjacent die by a solder joint 22.

As shown, the second die 16 may be landed on the through silicon via 14 of the first die 12 without a silicon spacer (not shown) being located between the first die 12 and the second die 16. Where the additional solder joint 22 is coupled between the through silicon via 14 of the first die 12 and the through silicon via 14 of the second die 16, the need for a silicon spacer (not shown) located between the first die 12 and the second die 16 may be eliminated.

A heat spreader 24 may be thermally coupled to the die stack 17. The heat spreader 24 may be positioned beneath the first die 12 and adjacent the mount 18. The heat spreader 24 may dissipate heat generated by the die stack 17 during operation.

Figure 2:
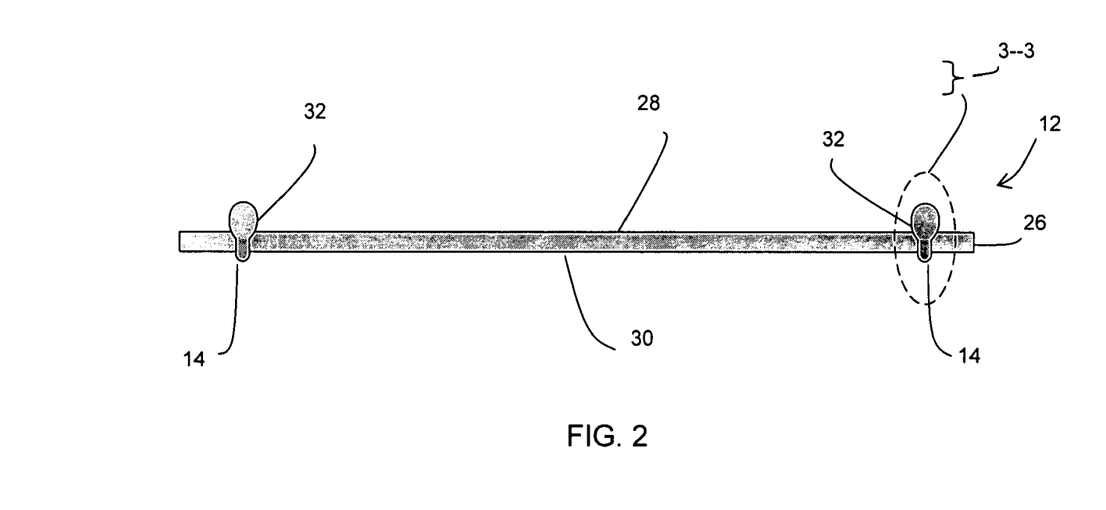
FIG. 2 is a cross sectional view illustrating an example die portion of an electronic package, in accordance with an embodiment of the present invention.

FIG. 2 illustrates an example die portion of an electronic package 10, in accordance with an embodiment of the present invention. The first die 12 may be formed in a rectangular piece of semiconductor substrate 26. Examples of the material suitable for a semiconductor substrate 26 include, but are not limited to silicon, silicon on sapphire, and gallium arsenide.

The through silicon via 14 of the first die 12 may pass through opposing surfaces 28 and 30 of the first die 12. The surface 28 may be an active surface while the surface 30 may be a back surface. Alternatively, the surface 28 may be a back surface while the surface 30 may be an active surface. The term "active surface", as used herein, means the surface which carries integrated circuitry. The term "back surface", as used herein, means a side of the die that is positioned opposite and parallel planar with the active surface.

A solder bump 32 may be attached to one end of the through silicon via 14 of the first die 12 on surface 28 of the first die 12. Examples of materials suitable for forming solder bump 32 include, but are not limited to lead based solder materials, non-lead based solder materials and the like. For the purpose of this application, the term "solder bump" as used herein is to be accorded a broad meaning, including "solder bumps" of any variety of suitable materials (including but not limited to lead, lead/tin alloys, lead free alloys (such as tin/silver, tin/copper/silver, and copper alloys), and the like), having suitable material properties (including but not limited to eutectic solder), used in a wide range of packaging techniques (including but not limited to flip-chip), and processes (including but not limited to controlled collapse chip connection (C4)).

Figure 3:
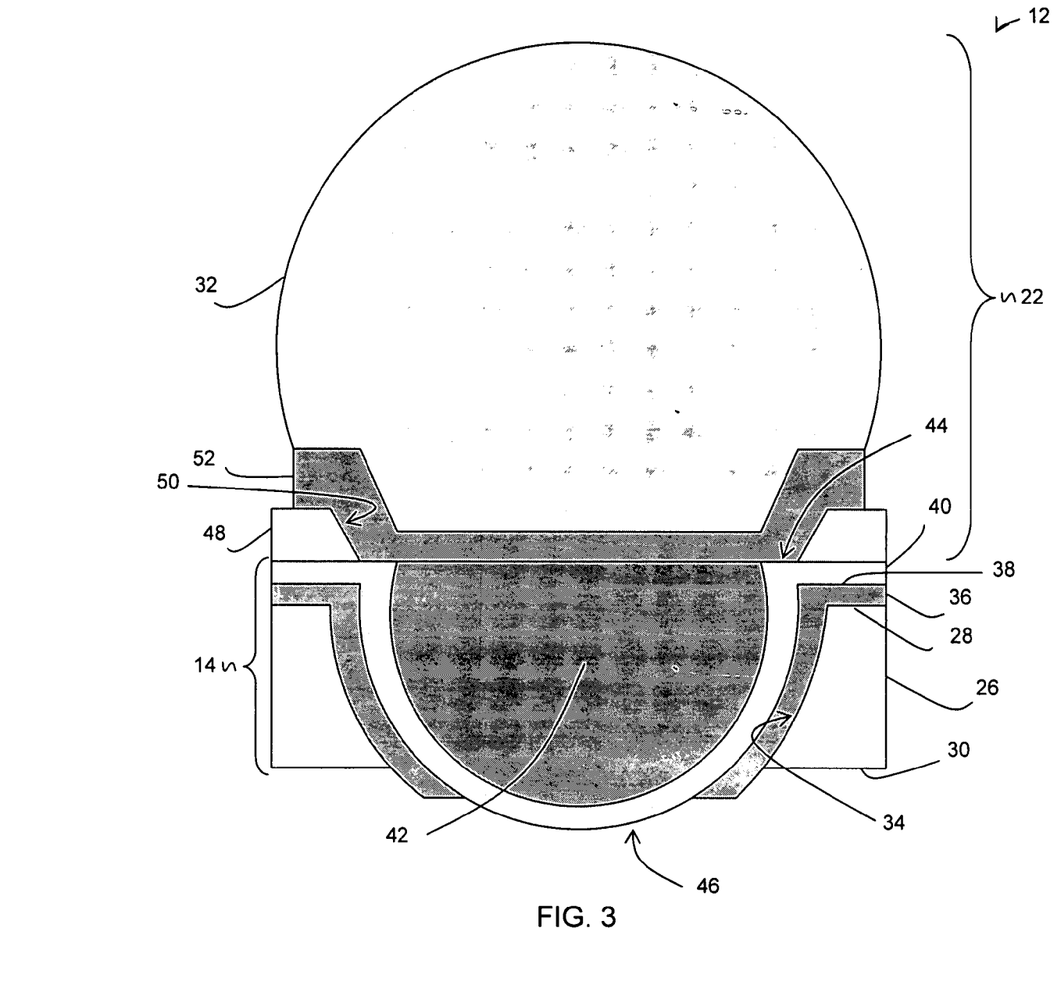
FIG. 3 is an enlarged cross sectional view illustrating an example die portion of an electronic package taken along line 3-3 of FIG. 2, in accordance with an embodiment of the present invention.

FIG. 3 illustrates an example die portion of an electronic package 10, in accordance with an embodiment of the present invention. A cup 34 may be formed in the semiconductor substrate 26 to receive the through silicon via 14 of the first die 12. The cup 34 may be formed by any suitable method, according to the requirements of the particular application. Examples of methods suitable for forming the cup 34 include, but are not limited to etching and the like.

The through silicon via 14 of the first die 12 may include a dielectric layer 36 coating the cup 34. The dielectric layer 36 may be deposited by any suitable method, according to the requirements of the particular application. The dielectric layer 36 may be formed of any suitable material, according to the requirements of the particular application. Examples of materials suitable for forming dielectric layer 36 include, but are not limited to silicon dioxide and the like.

An adhesion layer 38 may be placed on top of the dielectric layer 36 inside the cup 34. The adhesion layer 38 may be deposited by any suitable method, according to the requirements of the particular application. The adhesion layer 38 may be formed of any suitable material, according to the requirements of the particular application.

An interconnect contact 40 may be placed on top of the adhesion layer 38 inside the cup 34. The interconnect contact 40 may be deposited by any suitable method, according to the requirements of the particular application. Examples of methods suitable for depositing the interconnect contact 40 include, but are not limited to electroplating, electroless plating, physical vapor deposition (PVD), and the like. The interconnect contact 40 may be formed of any suitable material, according to the requirements of the particular application. Examples of materials suitable for forming interconnect contact 40 include, but are not limited to copper and the like.

A cavity fill 42 may be placed on top of the interconnect contact 40 to fill in the remaining space created inside the cup 34. The cavity fill 42 may be additional conductor material connected to interconnect contact 40, or may alternatively be dielectric material. The cavity fill 42 may be deposited by any suitable method, according to the requirements of the particular application. Where cavity fill 42 is additional conductor material, the examples of methods suitable for depositing the cavity fill 42 include, but are not limited to electroplating, electroless plating, physical vapor deposition (PVD), and the like. The cavity fill 42 may be formed of any suitable material, according to the requirements of the particular application. Where cavity fill 42 is additional conductor material, the examples of materials suitable for forming cavity fill 42 include, but are not limited to copper and the like. Where cavity fill 42 is dielectric material, the examples of materials suitable for forming dielectric layer 36 include, but are not limited to silicon dioxide and the like.

The interconnect contact 40 may form a top contact surface 44 on the surface 28 of the first die 12. The surface 30 of semiconductor substrate 26 may be thinned to expose a bottom contact surface 46 of the interconnect contact 40.

A passivation layer 48 may be placed over the top contact surface 44 of interconnect contact 40. The passivation layer 48 may include a pad opening 50 positioned over the top contact surface 44 of interconnect contact 40. The pad opening 50 exposes at least a portion of the top contact surface 44 of interconnect contact 40. The passivation layer 48 may be formed of a single layer of material, or may alternatively be formed of multiple layers of material. The passivation layer 48 may be formed of any suitable material, according to the requirements of the particular application. Examples of materials suitable for forming the passivation layer 48 include, but are not limited to inorganic material (such as silicon nitride, silicon oxide, and silicon oxynitride), polyimide material (such as polyimide/silicon nitride, polyimide/silicon oxide, and polyimide/silicon oxynitride), combinations thereof, and the like.

A layer of barrier layer metallurgy or ball limiting metallurgy 52 (referred to herein as BLM) may be deposited on top of the passivation layer 48. In embodiments where the solder bumps are non-lead based, the BLM 52 may typically be a barrier layer metallurgy; whereas in embodiments where the solder bumps are lead based, the BLM 52 may typically be a ball limiting metallurgy. Additionally, as used herein the term "BLM" may also include under bump metallization.

The BLM 52 may connect the solder bump 32 to the top contact surface 44 of interconnect contact 40. The BLM 52 may contact both the top contact surface 44 of interconnect contact 40 and the passivation layer 48. The BLM 52 may be deposited by any suitable method, according to the requirements of the particular application. Examples of methods suitable for depositing the BLM 52 include, but are not limited to sputtering, physical vapor deposition (PVD), and the like. The BLM 52 may be formed of any suitable material, according to the requirements of the particular application. Examples of materials suitable for forming BLM 52 include, but are not limited to titanium, nickel, chromium, copper, tantalum, nickel, vanadium, aluminum, combinations thereof, and the like.

Figure 4:
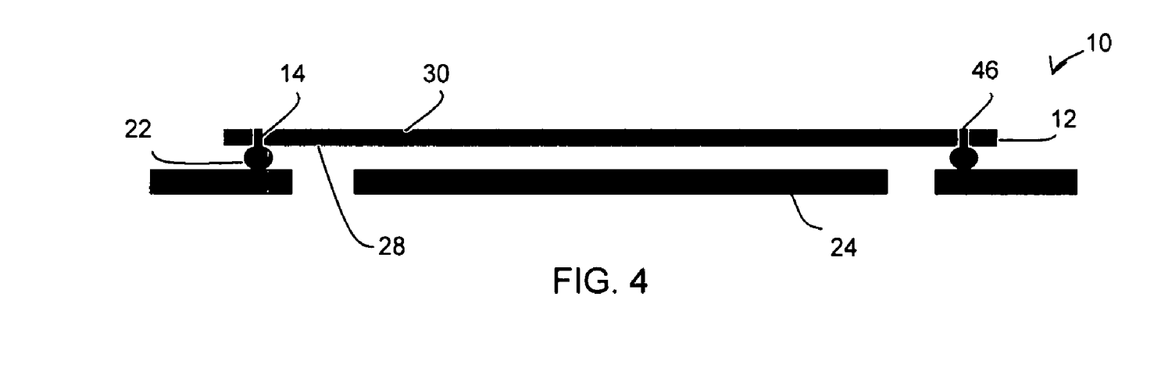
FIG. 4 is a cross sectional illustrating the example electronic package of FIG. 1 at a given stage of construction, in accordance with an embodiment of the present invention.

FIG. 4 illustrates an example electronic package 10 at a given stage of processing, in accordance with an embodiment of the present invention. Once the through silicon via 14 is formed in the first die 12 and the solder bump 32 (FIG. 3) is attached to the through silicon via 14, the first die 12 may be placed on the leads 20 of mount 18. The first die 12 may be placed with surface 28 facing down so that solder bumps 32 (FIG. 3) may contact the leads 20 of mount 18. Reflow of the solder bumps 32 (FIG. 3) may create a solder joint 22 between the through silicon via 14 of the first die 12 and the leads 20 of mount 18.

Once the first die 12 is placed with surface 28 facing down, the surface 30 of the first die 12 faces up exposing the bottom contact surface 46 of interconnect contact 40 (FIG. 3). The bottom contact surface 46 of interconnect contact 40 (FIG. 3) permits a second die 16 (FIG. 5) to be landed on the plurality of through silicon via 14 of the first die 12.

Figure 5:
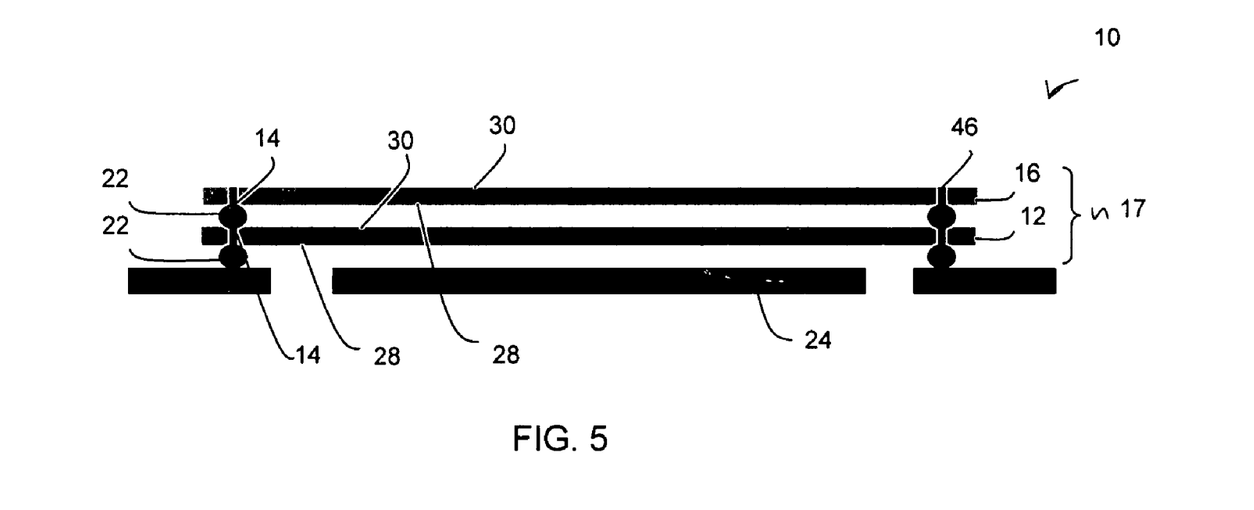
FIG. 5 is a cross sectional view illustrating an example electronic package depicted in FIG. 4 after further processing, in accordance with an embodiment of the present invention.

FIG. 5 illustrates an example electronic package 10 at a given stage of processing, in accordance with an embodiment of the present invention. Once the through silicon via 14 of the first die 12 is coupled to the leads 20 of mount 18, the second die 16 may be landed on the plurality of through silicon via 14 of the first die 12. The second die 16 may be of similar construction as first die 12 illustrated in FIGS. 2-3 having solder bumps 32 (FIG. 3) connected to a through silicon via 14 extending through the semiconductor substrate 26 (FIG. 3). The second die 16 may be placed with surface 28 facing down so that solder bumps 32 (FIG. 3) may contact the through silicon via 14 of the first die 12 (at the bottom contact surface 46 of interconnect contact 40, illustrated in FIG. 3). Reflow of the solder bumps 32 (FIG. 3) may create a solder joint 22 between the through silicon via 14 of the second die 16 and the through silicon via 14 of the first die 12.

Once the second die 16 is placed with surface 28 facing down, the surface 30 of the second die 16 faces up exposing the bottom contact surface 46 of interconnect contact 40 (FIG. 3). The bottom contact surface 46 of interconnect contact 40 (FIG. 3) permits an additional die (FIG. 6) to be landed on the plurality of through silicon via 14 of the second die 16.

As shown, the surface 28 of first die 12 and the surface 28 of the second die 16 may be oriented to face the same direction. As discussed above, the surface 28 may be an active surface while the surface 30 may be a back surface. Alternatively, the surface 28 may be a back surface while the surface 30 may be an active surface. The term "active surface", as used herein, means the surface which carries integrated circuitry. The term "back surface", as used herein, means a side of the die that is positioned opposite and parallel planar with the active surface. Accordingly, an active surface (28 or 30) on first die 12 and active surface (28 or 30) on second die 16 may be oriented to face the same direction. Alternatively, second die 16 may be formed to have an active surface (28 or 30) oriented to face a different direction than an active surface (28 or 30) on first die 12.

Figure 6:
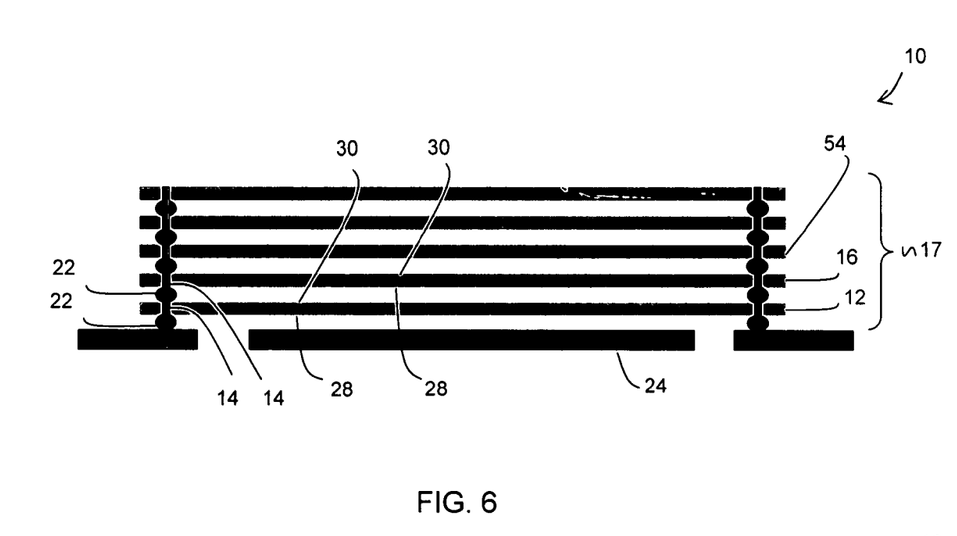
FIG. 6 is a cross sectional view illustrating an example electronic package depicted in FIG. 5 after further processing, in accordance with an embodiment of the present invention.

FIG. 6 illustrates an example electronic package 10 at a given stage of processing, in accordance with an embodiment of the present invention. Once the second die 16 is landed on the plurality of through silicon via 14 of the first die 12, an additional die 54 may be landed on the plurality of through silicon via 14 of the second die 16. The additional die 54 may be of similar construction as first die 12 illustrated in FIGS. 2-3, having solder bumps 32 (FIG. 3) connected to a through silicon via 14 extending through the semiconductor substrate 26 (FIG. 3). In this way, multiple die may be added to the die stack 17 through interconnected through silicon vias 14.

Referring back to FIG. 1, FIG. 1 illustrates a portion of an electronic package 10, in accordance with one embodiment. Once the die stack 17 is completed, over mold material 55 may be placed over the completed die stack 17.

Figure 7:
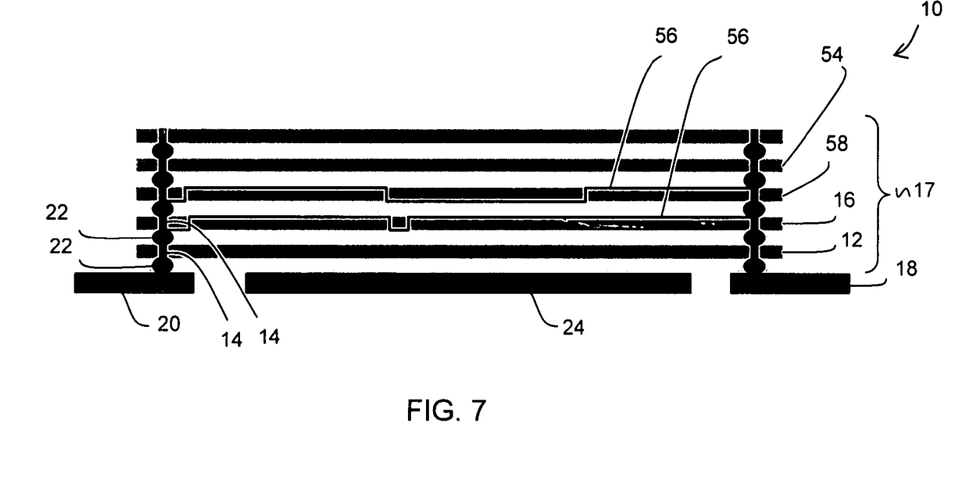
FIG. 7 is a cross sectional view illustrating another example electronic package, in accordance with an embodiment of the present invention.

FIG. 7 illustrates another example electronic package 10, in accordance with an embodiment of the present invention. A redirect path 56 may be provided in die stack 17. The redirect path 56 may be adapted to route a signal between the through silicon via 14 of the first die 12 and the through silicon via 14 of the second die 16. The redirect path 56 may particularly route a signal between the through silicon via 14 of the first die 12 and the through silicon via 14 of the second die 16 where the through silicon via 14 of the first die 12 and the through silicon via 14 of the second die 16 are not directly adjacent one another.

The redirect path 56 may be provided within the active portion of one or more of the die (12, 16, and/or 54). Additionally or alternatively, the redirect path 56 may be provided within one or more silicon spacers 58. The redirect path 56 containing silicon spacer 58 may be located in between adjacent die. For example, the redirect path 56 containing silicon spacer 58 may be located in between the second die 16 and the additional die 54, or may be located in between the first die 12 and the second die 16.

The redirect path 56 containing silicon spacer 58 may be of similar construction as first die 12 illustrated in FIGS. 2-3, having solder bumps 32 (FIG. 3) connected to a through silicon via 14 extending through the semiconductor substrate 26 (FIG. 3). The redirect path 56 may include one or more functional units, such as a logic device, an analog device, and/or a resistor device adapted to modify the redirected signal.

Figure 8:
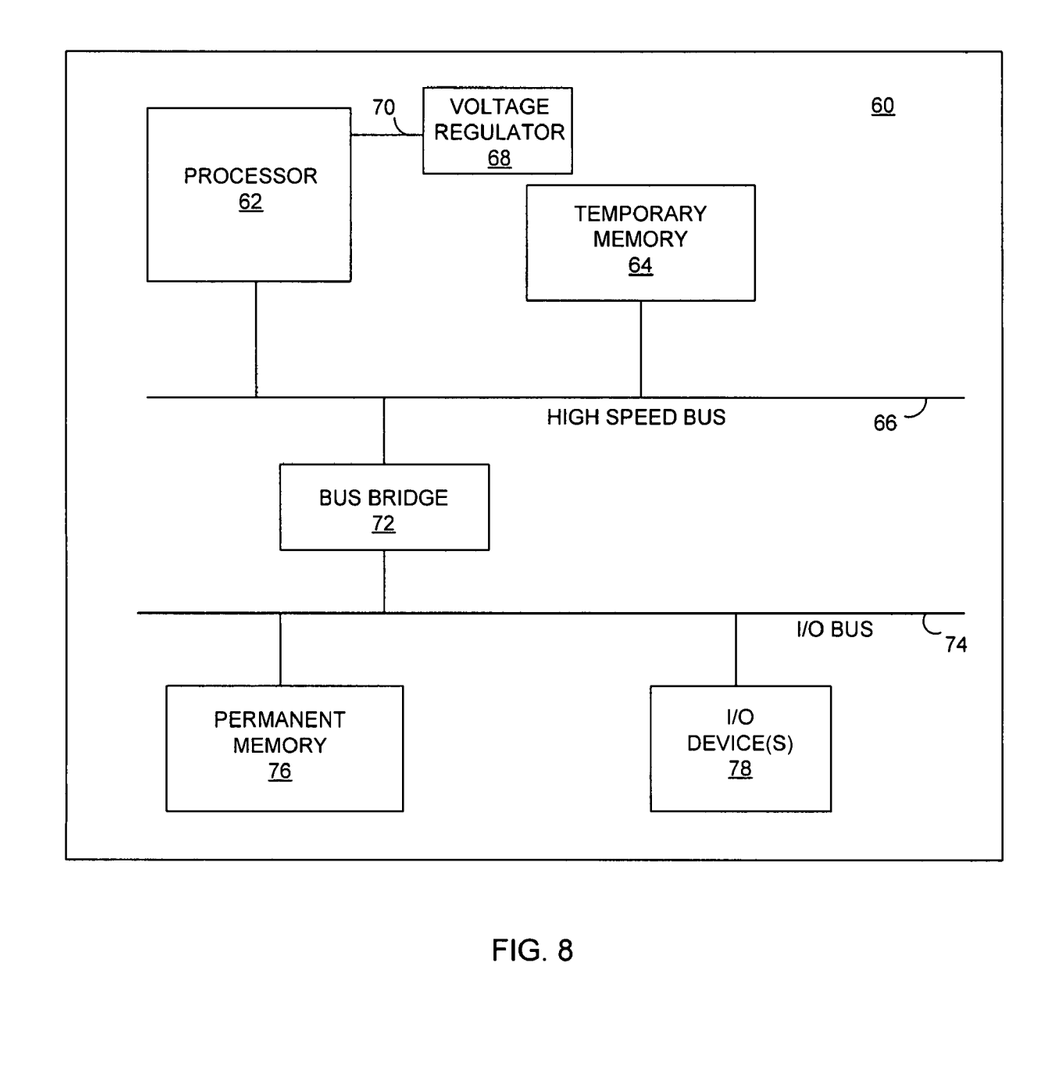
FIG. 8 is a system including an electronic package in accordance with an embodiment of the present invention.

FIG. 8 illustrates a block diagram of one of many possible electronic systems 60 in which embodiments of the present invention may be used. The electronic system 60 may utilize one or more embodiments of the electronic package 10 described herein. As shown, the system 60 includes a processor 62, such as an integrated circuit, and temporary memory 64, such as SDRAM and DRAM, on high-speed bus 66. Voltage regulator 68 may be utilized to provide power to processor 62 via traces 70. The high-speed bus 66 is connected through bus bridge 72 to input/output (I/O) bus 74. I/O bus 74 connects permanent memory 76, such as flash devices and mass storage device (e.g. fixed disk device), and I/O devices 78 to each other and bus bridge 72. In various embodiments, system 60 may be a set-top box, a digital camera, a CD player, a DVD player, a wireless mobile phone, a tablet computing device, or a laptop computing device.

One or more of the above-enumerated elements, such as processor 62, temporary memory 64, permanent memory 76, and so forth, may be included in the electronic package 10 described herein.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An electronic package, comprising:
   a mount having a lead;
   a first die having an active surface and a back surface, the active surface facing the mount, the first die further having a first through-silicon via landed on the lead;
   a silicon spacer landed on the first through-silicon via;
   a second die having an active surface and a back surface, the active surface of the second die facing the silicon spacer, the second die further having a second through-silicon via and landed on the silicon spacer; and
   a redirect path located in the silicon spacer, the redirect path adapted to route a signal between the first through-silicon via and the second through-silicon via, where the first through-silicon via and the second through-silicon via are not directly adjacent one another.

2. The electronic package of claim 1, wherein at least one of the first die and the second die is Flip Chip memory.

3. The electronic package of claim 1, wherein the mount is selected from the group consisting of a leadless quad flat-pack, a leadless small outline integrated circuit, a leadless TSOP, a leaded SOIC, a leaded quad flat-pack, and a leaded TSOP.

4. The electronic package of claim 1, further comprising a solder joint coupled to the first through-silicon via and physically coupled to the lead of the mount, and wherein the solder joint is selected from the group consisting of controlled collapse chip connection and eutectic solder.

5. The electronic package of claim 1, further comprising a solder joint coupled to the first through-silicon via and coupled to the silicon spacer, and wherein the solder joint is selected from the group consisting of controlled collapse chip connection and eutectic solder.

6. The electronic package of claim 1, wherein the redirect path includes one or more functional units adapted to modify the signal, wherein at least one of the one or more functional units is selected from the group consisting of a logic device; and an analog device.

7. The electronic package of claim 1, wherein the lead is physically coupled to the first through-silicon via by a solder joint.

8. The electronic package of claim 1, further comprising:
   a dielectric layer formed on a surface of the first through-silicon via;
   an adhesion layer formed on the dielectric layer;
   an interconnect contact material formed on the adhesion layer; and
   a cavity fill material formed on the interconnect contact material.

9. The electronic package of claim 1, wherein the redirect path includes one or more functional units adapted to modify the signal, the one or more functional units having a logic device and an analog device.

10. The electronic package of claim 1, further comprising a solder joint coupled to the silicon spacer and coupled to the second through-silicon via, and wherein the solder joint is selected from the group consisting of controlled collapse chip connection and eutectic solder.

11. A system comprising:
    an electronic package, comprising:
       a mount having a lead;
       a first die having an active surface and a back surface, the active surface facing the mount, the first die further having a first through-silicon via landed on the lead:
       a silicon spacer landed on the first through-silicon via;
       a second die having an active surface and a back surface, the active surface of the second die facing the silicon spacer, the second die further having a second through-silicon via and landed on the silicon spacer; and
       a redirect path located in the silicon spacer, the redirect path adapted to route a signal between the first through-silicon via and the second through-silicon via, where the first through-silicon via and the second through-silicon via are not directly adjacent one another;
    a bus coupled to the electronic package; and
    a mass storage coupled to the bus.

12. The system of claim 11, wherein the system is selected from the group consisting of a set-top box, a digital camera, a CD player, a DVD player, a wireless mobile phone, a tablet computing device, and a laptop computing device.

13. The system of claim 11, further comprising a solder joint coupled to the first through-silicon via and coupled to the silicon, and wherein the solder joint is selected from the group consisting of controlled collapse chip connection and eutectic solder.

14. The system of claim 11, wherein the redirect path includes one or more functional units adapted to modify the signal, wherein at least one of the one or more functional units is selected from the group consisting of a logic device and an analog device.

15. The system of claim 11, wherein the redirect path includes one or more functional units adapted to modify the signal, the one or more functional units having a logic device and an analog device.

16. The system of claim 11, further comprising a solder joint coupled to the silicon spacer and coupled to the second through-silicon via, and wherein the solder joint is selected from the group consisting of controlled collapse chip connection and eutectic solder.

* * * * *

UNITED STATES PATENT AND TRADEMARK OFFICE
CERTIFICATE OF CORRECTION

PATENT NO. : 7,317,256 B2 Page 1 of 1
APPLICATION NO. : 11/142972
DATED : January 8, 2008
INVENTOR(S) : Williams et al.

It is certified that error appears in the above-identified patent and that said Letters Patent is hereby corrected as shown below:

Column 7 Claim 6
Lines 37-38, "...a logic device; and an analog device." should read --...a logic device and an analog device.--.

Column 8 Claim 11
Line 13, "...the lead:..." should read --...the lead;...--.

Column 8 Claim 13
Line 34, "...the silicon, and..." should read --...the silicon spacer, and...--.

Signed and Sealed this

Thirty-first Day of March, 2009

JOHN DOLL
*Acting Director of the United States Patent and Trademark Office*